United States Patent [19]

Micheloni et al.

[11] Patent Number: 6,111,809
[45] Date of Patent: Aug. 29, 2000

[54] LINE DECODER FOR A LOW SUPPLY VOLTAGE MEMORY DEVICE

[75] Inventors: Rino Micheloni, Turate; Giovanni Campardo, Bergamo, both of Italy

[73] Assignee: STMicroelectronis, S.r.L., Agrate Brianza, Italy

[21] Appl. No.: 09/324,087

[22] Filed: Jun. 1, 1999

[30] Foreign Application Priority Data

Jun. 5, 1998 [IT] Italy ................................. TO98A0497

[51] Int. Cl.[7] .................................................... G11C 8/00
[52] U.S. Cl. .............................. 365/230.06; 365/185.18; 365/185.23
[58] Field of Search ......................... 365/185.18, 185.23, 365/185.29, 185.05, 189.09, 230.06

[56] References Cited

U.S. PATENT DOCUMENTS 5,721,704   2/1998   Morton ................................ 365/185.23
5,805,509   9/1998   Leung et al. ........................ 365/189.09

Primary Examiner—Son T. Dinh
Assistant Examiner—Van Thu Nguyen
Attorney, Agent, or Firm—Theodore E. Galathny, Esq.

[57] ABSTRACT

A decoder comprises a first line placed at a first reference potential ($V_{CC}$); a second line placed at a second reference potential switchable between the first reference potential and at least one programming potential higher than the first reference potential; a voltage elevator circuit connected to the second line, receiving a control signal and generating at an output a third reference potential switchable, on the basis of the control signal, between the first reference potential, the programming potential and a boosted potential which is between the first reference potential and the reference potential; a third line connected to the output of the voltage elevator circuit; an input circuit connected to the first line and receiving a predecoding signal, an output biasing circuit connected to said third line and generating a biasing signal for one line of the memory device; and switch circuit located between the input circuit and the biasing circuit, receiving a driving signal for selectively breaking the electrical connection between the input circuit and the biasing circuit on the basis of the driving signal.

16 Claims, 3 Drawing Sheets

LINE DECODER FOR A LOW SUPPLY VOLTAGE MEMORY DEVICE

TECHNICAL FIELD

This invention relates to a line decoder for a low supply voltage memory device.

BACKGROUND OF THE INVENTION

As is known, memory devices are typically organized as an array of memory cells in which word lines connect gate terminals of the cells placed on the same line and bit lines connect drain terminals of the cells placed on the same column. Individual lines of the memory array are then addressed by means of a line decoder receiving at the input a coded address.

A line decoder may be schematically represented by means of a plurality of inverters, one inverter for each line. Each inverter is made up of a "pull-up" transistor and a "pull-down" transistor and is controlled by a combinatorial circuit receiving at the input the coded addresses. The combinatorial circuit, in turn, causes the output of only one of the inverters, in particular the one that drives the selected address line, to a high logic value.

In order to guarantee the correct operation of the line decoder during both reading and programming phases of the memory cells, a PMOS reaction transistor is typically provided between the output of the line decoder and the input of each inverter. When turned on, the PMOS reaction transistor allows the input of the inverter to be brought to a voltage equal to the supply voltage, thus guaranteeing that the pull-up transistor of the inverter is completely turned off and the output voltage of the inverter is zero. Upstream of each inverter there is also a pass transistor, the purpose of which is to separate the low voltage part (predecoding) from the high voltage part (real decoding) so as to avoid malfunctions due to the possible direct biasing of drain/bulk junctions in the P-channel transistor located upstream.

At present there is a need to guarantee the operation of integrated devices at low supply voltage, especially to satisfy the typical low power consumption requirements of portable devices, for example, cellular phones.

On the other hand, the reduction of the supply voltage gives rise to a series of problems. In particular, reading memory cells becomes particularly delicate, as reading errors linked with the distribution of cell threshold voltages may arise. In fact, the reading voltage supplied to the gate terminals of the cells to be read is generally equal to the supply voltage, and consequently, all the erased cells having a threshold voltage close to the supply voltage will not conduct current during reading, or alternatively, will conduct very low current. Consequently, those cells will be erroneously read as written cells.

To solve this problem, a solution has been proposed that is based on the principle of raising the reading voltage. That is, supplying the gate terminal of the cell to be read with a voltage higher than the supply voltage that is generated by means of a special stage known as a "boost stage." In this way, even those erased cells having a threshold voltage very close to the supply voltage can be made conductive and be correctly read.

Currently, there are different solutions based on this principle. For example, continuous boost, global pulsed boost, local pulsed boost limited to one p-channel channel threshold, and local pulsed boost limited to two p-channel thresholds. Each of these aforementioned will be discussed in more detail below.

In the "continuous boost" solution, a boost condenser is gradually charged up to a voltage greater than the supply voltage by means of a train of pulses. The boost condenser then maintains a common memory line (boost line) at the desired overvoltage. This solution offers the advantage that the boost condenser does not need to be of a high capacity, since the overvoltage is produced by means of a series of small increases and so the area occupied by the condenser is relatively small. For this same reason, however, the time needed for the initial charging of the condenser is relatively long, so the memory devices that use this solution have a long access time after turning on or when reactivating after stand-by condition.

To overcome this problem, it is possible to use a second boost stage which keeps the boost condenser charged during stand-by condition, but consequently, the current consumption during the stand-by condition increases.

In the "global pulsed boost" solution, a boost condenser having a very high capacity is used and it is charged by means of a single pulse only when reading of a memory cell is requested. For example, when the addresses switch (during a reading step ) or when the chip enable signal switches to the active status, the high capacity boost condenser is charged. This solves the problems linked with the high access time when turning on or when returning from stand-by condition and with increased current consumption during stand-by condition. However, other problems arise, such as, the large area occupied by the high capacity boost condenser and the necessary driving circuits, and the timing of the condenser charging step.

The solutions with "local pulsed boost limited to one p-channel threshold" and "local pulsed boost limited to two p-channel thresholds" take advantage of the continuous boost and of the global pulsed boost, as they allow the reading voltage to be raised only when it is really necessary. These solutions are described in EP-A-0 814 481 and in European Patent Application No. 97830739.5 filed on Dec. 31, 1997.

However, these solutions are also not without problems. For example, in the case of the load pulsed boost limited to one-p-channel threshold solution, the boost voltage that can be generated must not exceed an upper limit equal to the supply voltage plus one p-channel threshold to guarantee turning on only the driving inverter of the line to be addressed and turning off of the driving inverters of the other lines in the same sector. Similarly, the boost voltage generated must not exceed the supply voltage plus two p-channel thresholds in the case of the local pulsed boost limited to two p-channel threshold solution. These limits on the boost voltage are quite incompatible with the demands of future generations of memory devices operating with supply voltages close to 1 V.

SUMMARY OF THE INVENTION

According to principles of the present invention, a line decoder is provided for a low supply voltage memory device that overcomes the above-mentioned problems. Further, provided is a method for reading a low supply voltage memory cell.

The features and advantages of a preferred embodiment in accordance with the present invention will now be described, purely as a non-limiting example, and with reference to the enclosed drawings.

DETAILED DESCRIPTION OF THE INVENTION

Figure 1:
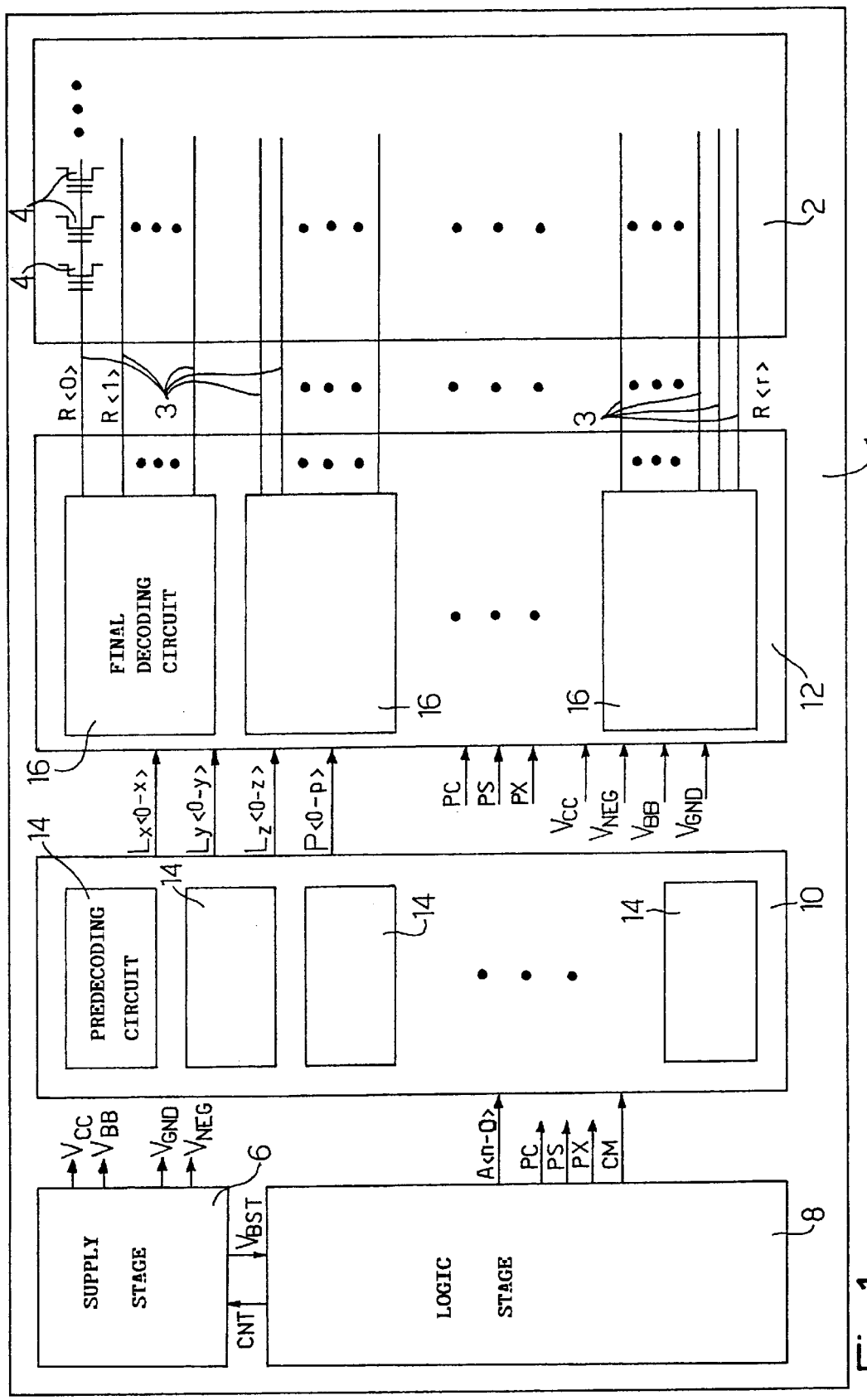
FIG. 1 shows the architecture of a memory device comprising an embodiment of a line decoder according to the present invention.

In FIG. 1, numeral 1 shows, as a whole, a memory device comprising a memory array 2 formed by a plurality of cells 4 arranged in rows and columns and a supply stage 6 for generating supply voltages $V_{CC}$, $V_{BB}$, $V_{NEG}$, $V_{BST}$ and $V_{GND}$. Also included is a logical stage 8 for generating address signals A<0–n>, a control signal CNT for the supply stage 6, a precharge signal PC, control signals CM, a driving signal PS, and an auxiliary signal PX described in detail below. A predecoding stage 10 receives at the input address signals A<0–n> and the control signals CM, and generates output predecoding signals Lx<0–x>, Ly<0–y>, Lz<0–z>and P<0–p>, where x, y, z and p are fixed numbers. A final decoding stage 12 receives the predecoding signals Lx, Ly, Lz and P, and the precharge signals PC, driving signals PS and auxiliary signal PX, and in response, generates biasing signals R<0–r> for a respective row 3 of the memory array 2, where r is the number of rows.

The precharge signals PC, control signals CM and driving signals PS, as well as the address signals A and the predecoding signals Lx, Ly, Lz and P, are logic signals with a low logic state defined by the ground voltage and a high logic state defined by the voltage $V_{CC}$. The auxiliary signal PX is a logic signal with a low logic state defined by the ground voltage and a high logic state defined by the voltage $V_{BB}$. The control signal CNT is a logic signal with a low logic state defined by the ground voltage and a high logic state defined by the voltage $V_{BB}$.

The predecoding stage 10 comprises a plurality of conventional predecoding circuits 14. The preceding circuits 14 receive different combinations of address signals A, and generates the respective predecoding signals Lx, Ly, Lz and P. Such preceding circuits 14 are well known in the art. The final decoding stage 12 comprises a plurality of final decoding circuits 16 that receive different combinations of predecoding signals Lx, Ly, Lz and P, and generate the biasing signals R.

Figure 2:
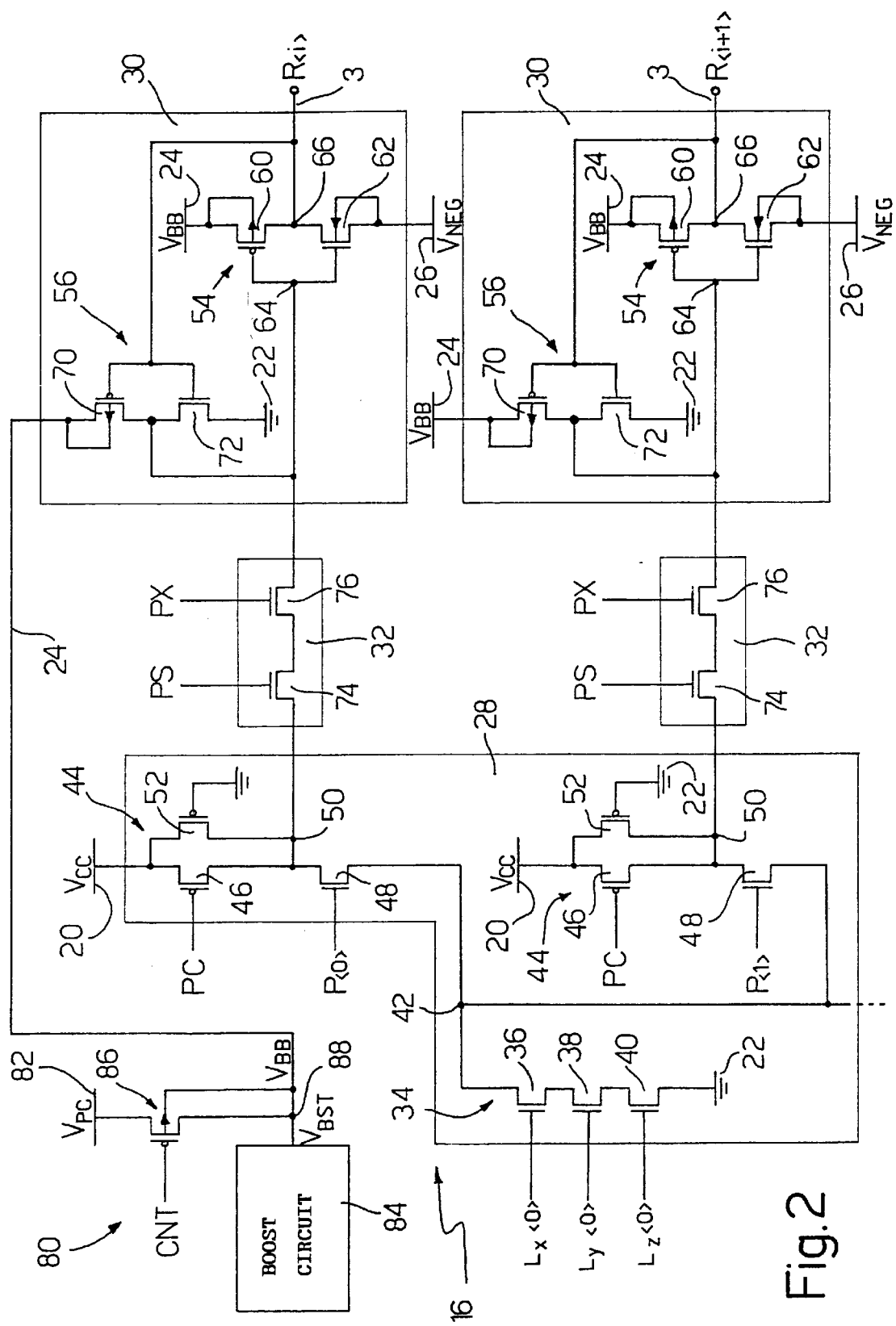
FIG. 2 shows a schematic diagram of an embodiment of the line decoder.

FIG. 2 shows the circuit diagram of a final decoding circuit 16 for driving two rows 3 of the memory array, indicated below as the i-th and the i+1-th row. Each final decoding circuit 16 receives the predecoding signals Lx, Ly and Lz, for example Lx<0>, Ly<0>, Lz<0>, but different precoding signals P. For example, the final decoding circuit 16 shown in FIG. 2 receives preceding signals P<0> and P<1> for generating the biasing signals R<i> and R<i+1> for the i-th and the i+1-th row, respectively.

The final decoding circuit 16 is connected to a first supply line 20 with supply voltage $V_{CC}$ (for example, equal to 1–3 V), to a ground line 22 with ground voltage $V_{GND}$ (0 V), to a second supply line 24 with supply voltage $V_{BB}$ and a third supply line 26 with a supply voltage $V_{NEG}$. The supply voltage $V_{BB}$ has different voltage values depending on the mode of operation. For example, during addressing of the cells 4, $V_{BB}$ is equal to the supply voltage $V_{CC}$, but during reading, it is equal to a boost voltage $V_{BST}$ greater than the voltage $V_{CC}$ (for example 3 V). When programming, $V_{BB}$ is equal to a programming voltage $V_{PP}$ greater than the boost voltage $V_{BST}$ (for example 12 V), and during particular operating modes described below, $V_{BB}$ is equal to a voltage $V_{ERP}$ having a value between voltage $V_{CC}$ and ground voltage $V_{GND}$ (for example 2 V). Similarly, the supply voltage $V_{NEG}$ also has different values depending on the mode of operation. For example, during reading and programming, $V_{NEG}$ is equal to ground voltage $V_{GND}$, and during erasing it is equal to an erasing voltage $V_{ERN}$ less than the ground voltage $V_{GND}$ (for example -8 V).

Each final decoding circuit 16 comprises an input circuit 28 of the type with dynamic logic NAND gate receiving at the input the predecoding signals Lx, Ly, Lz, P and the precharge signal PC. A plurality of output biasing circuits 30 of the "latch" type, one for each row 3 biased by the final decoding circuit 16 (two in the considered example), generating at the output the biasing signals R<i>, R<l+1>; also included are a plurality of switch circuits 32, one for each row 3 biased by the final decoding circuit 16. Each switch circuit 32 is inserted between the input circuit 28 and a respective biasing circuit 30, and receives the driving signal PS the auxiliary signal PX. The purpose of each switch circuit 32 is to selectively interrupt the connection between input circuit 28 and biasing circuits 30 on the basis of signals PS and PX.

The input circuit 28 includes a common selection circuit 34 comprising three NMOS transistors 36, 38 and 40 arranged in series with each other, inserted between a node 42 and the ground line 22. Each NMOS transistor 36, 38 and 40 receives a respective predecoding signal Lx<0>, Ly<0>and Lz<0>. The input circuit 28 also comprises a plurality of line selection circuits 44. There is one for each row 3 biased by the final decoding circuit 16. Each input circuit 28 is formed by a PMOS precharge transistor 46, and a NMOS selection transistor 48, having gate terminals receiving the precharge signal PC and the predecoding signal P respectively. The PMOS precharge transistor 46, and the NMOS selection transistor 48 have drain terminals connected with each other and defining a node 50, and source terminals connected to the first supply line 20 and to node 42 respectively. Each line selection circuit 44 further comprises a PMOS transistor 52 coupled in parallel with the respective precharge transistor 46 having a gate terminal connected to the ground line 22, a drain terminal connected to node 50, and a source terminal connected to the first supply line 20.

The PMOS transistor 52 has much smaller dimensions than those of the precharge transistor 46 and is always turned on. Its aim is to prevent the node 50 from floating in certain operating conditions, as explained below.

Each biasing circuit 30 comprises a first and a second inverter 54 and 56 mutually connected in anti-parallel, that is, having an output coupled to the input of the other inverter. In particular, the first inverter 54 comprises a pull-up PMOS transistor 60 and a pull-down NMOS transistor 62 having gate terminals connected with one another and defining a node 64. The drain terminals are connected with one another and define a node 66 on which the respective biasing signal R is present. The source terminals of the PMOS transistor 60 and the NMOS transistor 62 are connected to the second and to the third supply lines 24 and 26, respectively. The second inverter 56 comprises a pull-up PMOS transistor 70 and a pull-down NMOS transistor 72 having gate terminals connected with one another and to the node 66, drain terminals connected with one another and to the node 64, and source terminals connected respectively to the second supply line 24 and to the ground line 22.

In the case where the memory device works with the possibility of erasing known as "with negative gate" (which contemplates the application of a negative voltage to the gate terminals of the cells, and of a positive voltage to the source terminal, with a floating drain terminal), the NMOS transistor 62 must be realized in triple well while the NMOS transistor 72 may be made in a conventional manner. That is, the bulk of the NMOS transistor 62 must be made in a P-pocket formed in a $V_{CC}$-biased N-pocket, which is in turn formed in a grounded substrate.

Each switch circuit 32 comprises a first and a second NMOS "pass" transistor 74, 76 arranged in series with each another. The NMOS pass transistors 74 and 76 are inserted between the respective node 50 and the respective node 64 and receive on a gate terminal the driving signal PS and the auxiliary signal PX, respectively.

In the circuit in FIG. 2, transistors 46, 48 and 52 (upstream of the switch circuits 32) are of the low voltage type, that is, formed with thin gate oxide. In contrast, transistors 60, 62, 70, 72 (downstream of the switch circuits 32) are of the high voltage type, that is, formed with thick gate oxide.

FIG. 2 also shows the circuit diagram of a voltage elevator circuit 80 belonging to the supply stage 6 (FIG. 1) and generating a boost voltage $V_{BST}$. In particular the voltage elevator circuit 80 includes a fourth supply line 82 with a voltage $V_{PC}$ which, during reading, is equal to the supply voltage $V_{CC}$, and during programming, is equal to the programming voltage $V_{PP}$. Also included are a boost circuit 84 for generating the boost voltage $V_{BST}$, and a PMOS transistor 86 receiving on the gate terminal the control signal CNT. The drain terminal of the PMOS transistor 86 is connected to the fourth supply line 82, and the source terminal is connected to the output of the boost circuit 84 and defines therewith a node 88 to which the second supply line 24 is connected.

Figure 3:
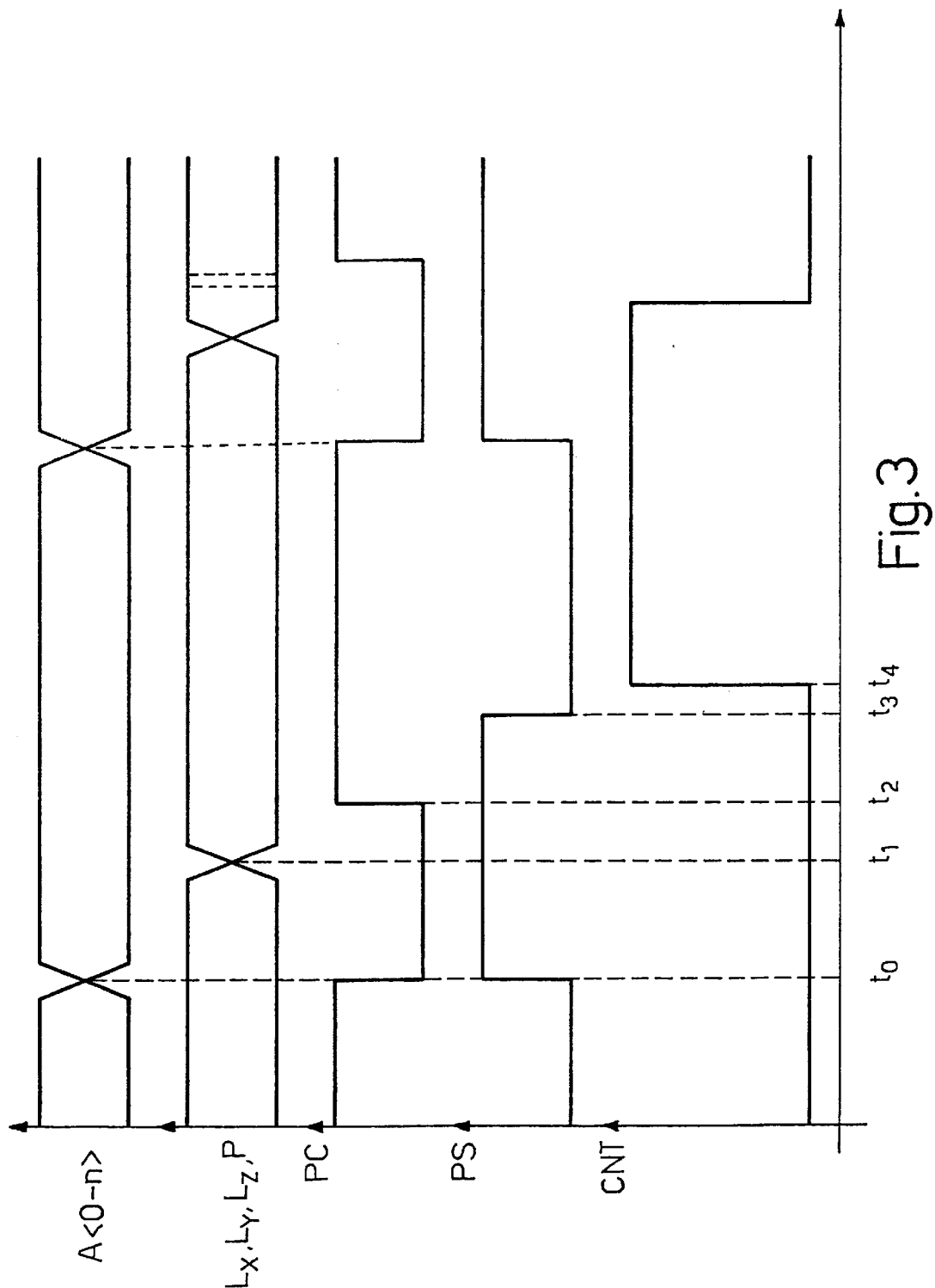
FIG. 3 shows various timing signals of the memory device of FIG. 1 according to the present invention.

The operation of the circuit in FIG. 2 will now be described with reference to FIG. 3. In particular, the following description will be made starting from an initial condition in which the address signals A and the predecoding signals Lx, Ly, Lz and P are stable, the precharge signal PC is in a high logic state, and the driving signal PS and the control signal CNT are in a low logic state.

Moreover, for ease of description, the operation of the circuit shown in FIG. 2 will be described at first without considering the pass transistors 76 of the switch circuits 32.

Initially, the control signal CNT is low turns on the PMOS transistor 86 to connect node 88 to the fourth supply line 82, whose voltage is therefore equal to $V_{PC}$ (as stated above, is equal to $V_{CC}$ when reading). The second supply line 24 is therefore at voltage $V_{CC}$.

As soon as a transition of address signals A is detected (time $t_0$ in FIG. 3), the precharge signal PC switches to the low logic state and the driving signal PS switches to the high logic state, thus starting the precharge step of input circuits 28. When the precharge signal PC goes into the low logic state and the driving signal PS goes into the high logic state, the precharge transistors 46 are turned on and connect nodes 50 to voltage $V_{CC}$ of the first supply line 20 (high logic state). The pass transistors 74 are also turned on and couple nodes 64 to voltage $V_{CC}$. In this situation, all biasing signals R are in the low logic state.

After a delay due to the propagation delay of the predecoding logic ports, the predecoding signals Lx, Ly, Lz and P switch (time $t_1$ in FIG. 3) to address the line that is to be read.

A certain time after logic state 8 has detected the address switch in a known way, the precharge signal PC switches again to the high logic state (time $t_2$ in FIG. 3), turning off the precharge transistors 46 and ending the precharge step.

In this situation, supposing that the predecoding signals Lx, Ly, Lz and P address the i-th row, the NMOS transistors 36, 38 and 40 of common selection circuit 34 turn on, pulling the node 50 associated with the i-th row to ground, which assures a low logic state. Since selection transistor 74 is turned on, the low logic state of node 50 causes the PMOS transistor 60 of the inverter 54 driving the i-th row to turn on and couple the node 66 to the second supply line 24. The signal R of the i-th row then goes into the high logic state, at voltage $V_{BB}$, which is now equal to $V_{CC}$.

The selection transistors 48 of line selection circuits 44 of the other lines in the same final decoding circuit 16 are turned off. Furthermore, PMOS transistor 52 of these other lines is turned on so that nodes 50 associated with the other lines of the sector remain in the high logic state defined during the precharge step. Thus, their signals R are maintained at ground. In this step the PMOS transistor 52 guarantees that node 50 associated with the non addressed lines does not remain floating after the precharge transistor 46 has been turned off, while avoiding high current consumption in the addressed line (i-th), on account of its small dimensions.

Next, the driving signal PS switches again to low logic state, turning off the pass transistors 74. In this step too, node 50 of line selection circuits 44 not related to the currently addressed line are kept securely in the high logic state by PMOS transistor 52. In this step, moreover, input circuit 28 and biasing circuit 30 are electrically separated from one another and biasing circuits 30 keep the previously-stored logic state.

After a brief delay, control signal CNT switches to the high logic state (time $t_4$ in FIG. 3) to start the boost step. The PMOS transistor 86 is turned off and voltage $V_{BB}$ switches from value $V_{CC}$ to value $V_{BST}$, that is, a voltage value greater than voltage $V_{CC}$.

Consequently, in the biasing circuit 30 associated with the i-th addressed row, node 66, which is connected to the second supply line 24 through the turned on PMOS transistor 60, takes biasing signal R<i> from voltage $V_{CC}$ to voltage $V_{BST}$, and allows the the cells placed on the i-th row to be read. The biasing signals R of the other non-addressed lines remain zero.

At the end of the boost step, the control signal CNT switches again to the low logic state to allow a low voltage addressing of another line.

The circuitry solution described above therefore allows the decoding operation to be carried out at voltage $V_{CC}$ and allows the boost operation to be carried out only when a reading operation is made.

The presence of NMOS transistor 72 in inverter 56 increases the switching speed from high to low level of node 64 of the addressed line, and therefore reduces the current consumption associated with simultaneously turning on the PMOS and NMOS transistors 70 and 72 during switching. In particular, in order to increase the switching speed of node 64 in the absence of transistor 72, the size of transistors 36, 38, 40, 48 should be increased, so that these rapidly ground node 64. In view of the number of transistors involved, this is not advantageous. Transistor 72 succeeds in making this switching faster because it acts directly and only on node 64 itself, and is driven at voltage $V_{BB}$, a voltage higher than $V_{CC}$. Moreover, inverter 56 guarantees that node 64 is maintained at the low logic state after switching of the driving signal PS and turning off of the pass transistor 74, thus preventing node 64 from floating.

Pass transistor 76, which is always turned on, of switch circuit 32 is useful if the supply line 24 has a value $V_{ERP}$ that is between $V_{CC}$ and ground ($V_{GND}$). For example, in the case of erasing or in the case of DMA (Direct Memory Access) to measure the trans-characteristics of array cells. Pass transistor 76 prevents there being direct conduction in the drain/body junction of PMOS transistors 70 of inverters 56, since auxiliary signal PX has the same timing as the driving signal PS described previously. The auxiliary signal PX has a low logic state equal to ground voltage, but has a high logic state equal to voltage $V_{ERP}$, a voltage lower than voltage $V_{CC}$.

In fact, in the absence of pass transistor 76, when nodes 50 and 64 are in the high logic state (at $V_{CC}$) and the second supply line 24 goes to DMA voltage $V_{ERP}$ that is lower than voltage $V_{CC}$, the drain terminal of PMOS (P-type) transistor 70 is at a higher voltage than the body (N-type) of transistor 70. Thus, the parasitic diode formed by drain and body regions themselves is turned on.

The presence of pass transistors 76, which receives signal PX at the high logic value, now equal to $V_{ERP}$, prevents this from happening, by preventing node 64 from rising to a voltage higher than $V_{ERP}$ minus the threshold voltage of the NMOS transistor 76.

If very low supply voltages $V_{CC}$ are used, for example less than 1.8 V, the threshold voltage lost by pass transistors 74 of switch circuits 32 may be recovered by carrying out a boost operation on driving signal PS. This operation is not particularly complicated if we take into account that driving signal PS is not selective but is common to all controlled switch circuits 32.

Some possible advantages, the circuitry structure described in FIG. 2 may have are the following. Firstly, it does not have the above-described limits for local boost and also allows any boost voltage value $V_{BST}$ to be applied to memory device word lines. Moreover, it allows exploitation of the typical advantages of local boost, as only the supply voltage of biasing circuits 30 is boosted.

Moreover, there is only one supply line to be boosted (line 24), so a single boost circuit is sufficient.

In addition, as there are no limits on boosting voltage, the line decoder according to this invention may be used both as continuous boost and as global pulsed boost, where a real charging pump is used. In this way, memory devices may be designed that operate at a very low supply voltage, even less than 1 V, as, when a charging pump is used for reading, the voltage applied to the gate terminals of the cells may be boosted to the desired value.

The embodiment according to the present invention allows an appreciable reduction of the dynamic consumption of line decoder 1.

The presence of NMOS transistors 72 allows the next cell to be addressed during reading of a previous cell. This may be referred to as "burst mode". In fact, during reading of a cell connected to the addressed i-th row, when the respective switch circuit 32 separates the addressed row from the predecoding stage 10 and from the respective input circuit 28, which can then receive a new address, the NMOS transistor 72 guarantees that node 64 associated with addressed line remains securely grounded. In this case, to guarantee the precharge of all the lines, including the one addressed previously, one of the predecoding signals Lx, Ly, Lz or P is brought briefly to zero, so as to allow precharging of all nodes 50 at supply voltage $V_{CC}$ and the consequent resetting of all rows i, as shown on the right-hand side of FIG. 3.

Finally, the circuitry solution according to the present invention has a smaller bulk than the solutions with high voltage predecoding.

Finally it is clear that modifications and variations may be made to the line decoder described and shown herein without departing from the scope of the present invention.

What is claimed is:

1. A line decoder for a memory device comprising:

a first reference line placed at a first reference potential;

a second reference line placed at a second reference potential switchable between said first reference potential and at least one programming potential having a value higher than said first reference potential;

at least one final decoding circuit comprising an input circuit connected to said first reference line and receiving a predecoding signal, an output biasing circuit generating a biasing signal, and a switch circuit electrically coupled between said input circuit and said output biasing circuit, said switch circuit receiving a driving signal for selectively breaking the electrical connection between said input circuit and said output biasing circuit on the basis of the driving signal;

a voltage elevator means connected to said second reference line, receiving a control signal, and generating at an output thereof a third reference potential, switchable on the basis of said control signal, between said first reference potential, said programming potential, and a boosted potential having a value between said first reference potential and said programming potential; and a third reference line connected to said output of said voltage elevator means and to said biasing circuit.

2. The decoder according to claim 1 wherein said biasing circuit comprises a first and a second inverters mutually connected in anti-parallel.

3. The decoder according to claim 2, further comprising a fourth reference line placed at a fourth reference potential less than said first reference potential and a fifth line placed at a fifth reference potential switchable between said fourth reference potential and an erasing potential less than said fourth reference potential; said first inverter being connected between said third and fifth reference lines, and said second inverter being connected between said third and fourth lines.

4. The decoder according to claim 3 wherein said second inverter comprises first and second transistors that are complementary to one another, and have control terminals connected with each other and with an output terminal of said first inverter, said first and second transistors further having first terminals connected with each other and with an input terminal of said first inverter, and second terminals connected to said third line and to said fourth reference line, respectively.

5. The decoder according to claim 3 wherein said third reference potential of said third line is switchable between said first reference potential, said programming potential, and a sixth reference potential, having a value between said fourth and first reference potential, said switch circuit comprises first and second pass transistors connected in series between said input circuit and said biasing circuit, said first pass transistor receiving said driving signal on a control terminal thereof, said driving signal being switchable between said first and fourth reference potentials, said second pass transistor receiving an auxiliary signal on a control terminal thereof, said auxiliary signal being switchable between said sixth and fourth reference potentials.

6. A method for reading a memory cell belonging to a memory line by means of a line decoder having a reference line placed at a first reference potential, a biasing line placed at a second reference potential switchable between said first reference potential, a programming potential having a value higher than said first reference potential, and a boosted potential having a value between said first reference potential and said programming potential, the method comprising:

sending address signals to a selection circuit;

placing said second reference potential of said biasing line equal to said first reference potential;

switching a biasing signal of said line;

electrically separating said line from said selection circuit; and switching said second reference potential of said biasing line from said first reference potential to said boosted potential.

7. The method according to claim 6, further comprising reading said memory cell and at the same time sending new address signals to said selection circuit while said second reference potential of said biasing line is at said boosted potential.

8. The method according to claim 7, further comprising:

switching said second reference potential of said biasing line to said first reference potential;

electrically connecting said line to a precharge circuit of said selection circuit; and switching a biasing signal of a new line.

9. A line decoder for a memory device, comprising:

an input circuit having an input coupled to receive a predecoded signal and an output to provide activation signal, the input circuit coupled to a supply terminal providing a supply signal having a first voltage value;

at least one switching circuit coupled to the output of the input circuit to selectively provide the activation signal at an output terminal in response to a driving signal applied to a driving terminal;

a boost circuit having a control terminal and a reference terminal, the boost circuit providing at the reference terminal a reference signal alternatively having the first voltage value, a boosted voltage value, or a programming voltage value in response to a control signal applied to the control terminal, the boosted voltage value being greater than the first voltage value and less than the programming voltage value; and at least one output driving circuit coupled to the output of the switching circuit to receive the activation signal and further coupled to the reference terminal of the boost circuit to receive the reference signal, the output driving circuit further having a bias terminal for providing a biasing signal.

10. The line decoder of claim 9 wherein the output driving circuit comprises first and second inverters each having an output terminal coupled to an input terminal of the other inverter.

11. The line decoder of claim 10 wherein the first inverter is further coupled to the output of the boost circuit and to a second supply terminal providing a supply signal having a second voltage value, and the second inverter is further coupled to the output of the boost circuit and to a third supply terminal providing a third supply signal having alternatively the second voltage value and an erasing voltage value, the second voltage value being less than the first voltage value and greater than the erasing voltage value.

12. The line decoder of claim 11 wherein the first inverter comprises:

a first transistor having a first control terminal, a first source terminal, and a first drain terminal, the first source terminal coupled to the output of the boost circuit; and a pull down transistor having a second control terminal, a second source terminal, and a second drain terminal, the control terminal coupled to the first control terminal and the output of the second inverter, the second source terminal coupled to the second supply terminal, and the second drain terminal coupled to the first drain terminal and the input of the second inverter.

13. The line decoder of claim 10 wherein the switch circuit comprises first and second pass transistors series coupled between the output of the input circuit and the at least one output driving circuit, the first pass transistor having a control terminal coupled to receive the driving signal and the second pass transistor having a control terminal coupled to receive an auxiliary signal, the driving signal alternatively having a voltage value equal to the first and second voltage values, the auxiliary signal alternatively having a voltage value equal to a DMA voltage value and the second voltage value, the DMA voltage value being less than the first voltage value and greater than the second voltage value.

14. A method for activating in a memory device a selected row of memory cells coupled to a selected word line, comprising:

generating at a selection circuit predecoding signals corresponding to an address of the selected row, and providing the predecoding signals to an input circuit coupled to an output driving circuit associated with the word line of the selected row;

setting a reference signal provided to the output driving circuit to have a voltage value equal to a first voltage value;

coupling the word line of the selected row to the reference signal at the output driving circuit;

decoupling the output driving circuit from the input circuit; and switching the voltage value of the reference signal from the first voltage value to a boosted voltage value that is greater than the first voltage value.

15. The method of claim 14, further comprising:

subsequent to switching the voltage value, accessing the selected row of memory cells; and generating new predecoding signals corresponding to an address of a newly selected row during the time the selected memory cells are being accessed.

16. The method of claim 15, further comprising:

subsequent to generating new predecoding signals, switching the voltage value of the reference signal from the boosted voltage value to the first voltage value;

precharging the output driving circuit associated with the selected row; and coupling a word line of the newly selected row to the reference signal at the output driving circuit associated with the newly selected row.

* * * * *